(12) United States Patent
Varghese et al.

(10) Patent No.: US 11,454,876 B2
(45) Date of Patent: Sep. 27, 2022

(54) EUV MASK BLANK ABSORBER DEFECT REDUCTION

(71) Applicant: Applied Materials, Inc., Santa Clara, CA (US)

(72) Inventors: Binni Varghese, Singapore (SG); Vibhu Jindal, San Jose, CA (US); Azeddine Zerrade, Singapore (SG); Shiyu Liu, Singapore (SG); Ramya Ramalingam, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 165 days.

(21) Appl. No.: 17/120,779

(22) Filed: Dec. 14, 2020

(65) Prior Publication Data
US 2022/0187696 A1    Jun. 16, 2022

(51) Int. Cl.
*G03F 1/22* (2012.01)
*G03F 1/54* (2012.01)

(52) U.S. Cl.
CPC . *G03F 1/22* (2013.01); *G03F 1/54* (2013.01)

(58) Field of Classification Search
CPC ................. G03F 1/22; G03F 1/24; G03F 1/54
USPC ............................................................. 430/5
See application file for complete search history.

(56) References Cited

U.S. PATENT DOCUMENTS

| 2015/0079502 A1* | 3/2015 | Suzuki | G03F 1/22 |
| | | | 430/5 |
| 2015/0111134 A1* | 4/2015 | Suzuki | G03F 1/38 |
| | | | 430/5 |

* cited by examiner

*Primary Examiner* — Christopher G Young
(74) *Attorney, Agent, or Firm* — Servilla Whitney LLC

(57) ABSTRACT

Methods of coating extreme ultraviolet (EUV) reticle carrier assemblies are disclosed. The method includes depositing an adhesion layer on the EUV reticle carrier assembly, depositing at least one EUV absorber layer on the EUV reticle carrier assembly and depositing a stress-relieving layer on EUV reticle carrier assembly. The coated EUV reticle carrier assemblies exhibit reduced particle defect generation during EUV mask blank manufacturing.

20 Claims, 3 Drawing Sheets

EUV MASK BLANK ABSORBER DEFECT REDUCTION

TECHNICAL FIELD

Embodiments of the present disclosure relate generally to extreme ultraviolet lithography. In particular, specific embodiments of the present disclosure relate to extreme ultraviolet mask blanks with an absorber and methods of manufacture.

BACKGROUND

Extreme ultraviolet (EUV) lithography, also known as soft x-ray projection lithography, has begun to replace deep ultraviolet lithography for the manufacture of 0.13 micron and smaller minimum feature size semiconductor devices. Extreme ultraviolet light, which is generally in the 5 to 100 nanometer wavelength range, is strongly absorbed in virtually all materials. For that reason, extreme ultraviolet systems work by reflection rather than by transmission of light. An EUV mask, which is made from an EUV mask blank coated with a non-reflective absorber mask pattern, is used to reflect patterned actinic light onto a resist-coated semiconductor substrate.

EUV mask blanks are coated with reflective multilayer coatings of materials such as molybdenum and silicon. EUV mask blanks exhibit reflection values of approximately 62-70% at a wavelength of 13.5 nanometers. Conventional EUV mask blank production includes placing an EUV mask blank into a carrier assembly that is then placed into a processing chamber. In the processing chamber, multiple different layers are deposited on the EUV carrier assembly, including absorber layer(s).

EUV mask blanks have a low tolerance for defects on the working area of the mask blank. Existing methods of processing EUV mask blanks, which are smaller than 300 mm diameter wafers, yield EUV mask blanks with a greater number of defects compared to 300 mm wafers when subjected to similar deposition conditions in the same chamber. Therefore, there is a need for methods of producing EUV mask blanks with reduced defects.

SUMMARY

One aspect of the present disclosure pertains to a method of coating an extreme ultraviolet (EUV) reticle carrier assembly. The method comprises depositing an adhesion layer on an EUV reticle carrier assembly, the EUV reticle carrier assembly comprising a carrier base and a carrier top shield having an opening configured to receive an EUV reticle blank and the EUV reticle carrier assembly comprising a surface stress and a surface energy, the adhesion layer having a surface energy such that the adhesion layer does not increase the surface stress of the EUV reticle carrier assembly; depositing at least one EUV absorber layer on the EUV reticle carrier assembly, the at least one EUV absorber layer having an EUV absorber layer surface energy that is intermediate to the EUV reticle carrier assembly surface energy and the adhesion layer surface energy; and depositing a stress-relieving layer on EUV reticle carrier assembly, the stress-relieving layer having a surface energy that is less than the EUV absorber layer surface energy of the at least one EUV absorber layer.

In another aspect, a method of coating an extreme ultraviolet (EUV) reticle carrier assembly comprises: placing a dummy EUV reticle blank in an opening of an EUV reticle carrier assembly, the EUV reticle carrier assembly comprising a carrier base, and a carrier top shield having the opening therein configured to receive an EUV reticle blank, the EUV reticle carrier assembly comprising a surface stress and a surface energy; depositing an adhesion layer on the EUV reticle carrier assembly, the adhesion layer the adhesion layer having a surface energy such that the adhesion layer does not increase the surface stress of the EUV reticle carrier assembly; depositing at least one EUV absorber layer on the EUV reticle carrier assembly, the at least one EUV absorber layer having an EUV absorber layer surface energy that is intermediate to the EUV reticle carrier assembly surface energy and the adhesion layer surface energy; replacing the dummy EUV reticle blank with an EUV reticle blank in the opening of the carrier top shield; depositing a stress-relieving layer on EUV reticle carrier assembly, the stress-relieving layer having a surface energy that is less than the EUV absorber layer surface energy of the at least one EUV absorber layer; and depositing alternating layers of the at least one EUV absorber layer and the stress-relieving layer on the EUV reticle carrier assembly.

DETAILED DESCRIPTION

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

The present disclosure provides methods for producing EUV mask blanks with reduced defects. Specifically, the disclosure provides improved methods of coating EUV reticle carrier assemblies that hold EUV mask blanks (also referred to as EUV reticle blanks) during the EUV mask blank manufacture process. In one approach, an EUV reticle carrier assembly is coated with an adhesion layer, at least one EUV absorber layer and a stress-relieving layer. In further approaches, after the EUV reticle carrier assembly is coated with an adhesion layer and at least one EUV absorber layer, the EUV reticle carrier assembly is coated with alternating layers of at least one EUV absorber layer and a stress-relieving layer.

As used in this specification and the appended claims, the terms "EUV reticle blank," "dummy EUV reticle blank," "EUV mask blank," "reticle blank," and "mask blank" can be used interchangeably. In specific embodiments, an EUV reticle blank is a dummy EUV reticle blank which may serve as a sacrificial EUV reticle blank used between subsequent depositions of layers as disclosed herein.

It has been discovered that a specific source of defects in the manufacture of EUV mask blanks is the EUV reticle carrier assembly used in the manufacture of EUV mask blanks. During the manufacture of EUV mask blanks, an EUV mask blank is placed within an EUV reticle carrier assembly. Processing of EUV mask blanks may include, for example, placing a square (150 mm×150 mm) EUV mask blank in an EUV reticle carrier assembly. Together, the EUV reticle blank and carrier assembly are then placed into processing chambers to then deposit layers on the EUV reticle carrier assembly.

Figure 1:
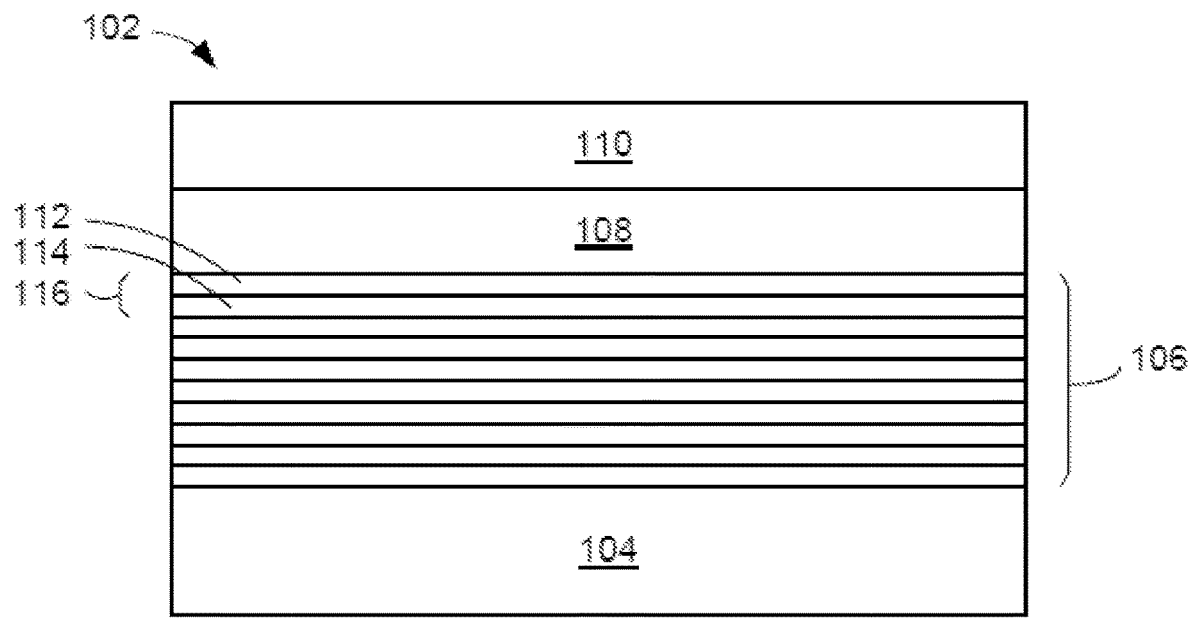
FIG. 1 illustrates a cross-sectional view of layers of an EUV mask blank according to one or more embodiments.

Referring now to FIG. 1, a cross-sectional view of layers of an EUV mask blank 102 is shown. The EUV mask blank 102 comprises a substrate 104, a multilayer stack 106, and a capping layer 108. The EUV mask blank 102 (or EUV reticle blank) can be used to form a reflective mask or reflective reticle by patterning the absorber layer 110 with the layout of the circuitry required.

In one or more embodiments, the substrate 104 is an element for providing structural support to the EUV mask blank 102. The substrate 104 can be made from a material having a low coefficient of thermal expansion (CTE) to provide stability during temperature changes. The substrate 104 can have properties such as stability against mechanical cycling, thermal cycling, crystal formation, or a combination thereof. The substrate 104 can be formed from a material such as silicon, glass, oxides, ceramics, glass ceramics, or a combination thereof.

The multilayer stack 106 is a structure that is reflective to extreme ultraviolet light. The multilayer stack 106 includes alternating reflective layers of a first reflective layer 112 and a second reflective layer 114. The first reflective layer 112 and the second reflective layer 114 can form a reflective pair 116. The multilayer stack 106 can include a range of 40-60 of the reflective pairs 116 for a total of up to 120 reflective layers. However, it is understood that more or fewer layers can be used as needed.

The first reflective layer 112 and the second reflective layer 114 can be formed from a variety of materials. In one or more embodiments, the first reflective layer 112 and the second reflective layer 114 can be formed from silicon and molybdenum, respectively. Although the multilayer stack 106 is described as having the first reflective layer 112 formed from silicon and the second reflective layer 114 formed from molybdenum, other configurations are possible. For example, the first reflective layer 112 can be formed from molybdenum and the second reflective layer 114 can be formed from silicon. The multilayer stack 106 forms a reflective structure by having alternating thin layers of materials with different optical properties to create a Bragg mirror. In some embodiments, each of the alternating layers can have dissimilar optical constants.

The multilayer stack 106 can be formed in a variety of ways. For example, in some embodiments the first reflective layer 112 and the second reflective layer 114 can be formed with magnetron sputtering, ion sputtering systems, pulsed laser deposition, cathode arc deposition, or a layer deposition technique.

In an illustrative example, the multilayer stack 106 can be formed using a physical vapor deposition technique, such as magnetron sputtering. The first reflective layer 112 and the second reflective layer 114 of the multilayer stack 106 can have the characteristics of being formed by the magnetron sputtering technique, including precise thickness, low roughness, and clean interfaces between the layers. The first reflective layer 112 and the second reflective layer 114 of the multilayer stack 106 can have the characteristics of being formed by the physical vapor deposition including precise thickness, low roughness, and clean interfaces between the layers.

The physical dimensions of the layers of the multilayer stack 106 formed using the physical vapor deposition technique can be precisely controlled to increase reflectivity. For example, the first reflective layer 112, such as a layer of silicon, can have a thickness of 3.5 nm. The second reflective layer 114, such as a layer of molybdenum, can have a thickness of 3.5 nm. However, it is understood that the thickness of the first reflective layer 112 and the second reflective layer 114 can vary based on engineering needs, the wavelength of extreme ultraviolet light and the optical properties of the layer materials.

In one or more embodiments, the capping layer 108 is a protective layer transparent to extreme ultraviolet light. The capping layer 108 can be formed directly on the multilayer stack 106. The capping layer 108 can protect the multilayer stack 106 from contaminants and mechanical damage. For example, the multilayer stack 106 can be sensitive to contamination by oxygen, carbon, hydrocarbons, or a combination thereof. The capping layer 108 can interact with the contaminants to neutralize them. The capping layer 108 is an optically uniform structure that is transparent to extreme ultraviolet light. The extreme ultraviolet light can pass through the capping layer 108 to reflect off of the multilayer stack 106.

The capping layer 108 can be formed in a variety of ways. For example, the capping layer 108 can be formed directly on the multilayer stack 106 with magnetron sputtering, ion sputtering systems, ion beam deposition, electron beam evaporation, radio frequency (RF) sputtering, atomic layer deposition (ALD), pulsed laser deposition, cathode arc deposition, physical vapor deposition, or a combination thereof. The capping layer 108 can have the physical characteristics of being formed by the magnetron sputtering technique including precise thickness, low roughness, and clean interfaces between the layers.

The absorber layer 110 is a layer that can absorb the extreme ultraviolet light. The absorber layer 110 can be used to form the pattern on the reflective mask 106 by providing areas that do not reflect the extreme ultraviolet light. In one or more embodiments, the absorber layer 110 can be a material having a high absorption coefficient for a particular frequency of the extreme ultraviolet light, such as about 13.5 nm. In an illustrative example, the absorber layer 110 can be formed from chromium, tantalum, nitrides, nickel, alloys, or a combination thereof. In another example, the absorber layer can be formed from an alloy of tantalum, boron, and nitrogen in various ratios.

The absorber layer 110 can be formed directly on the capping layer 108. The absorber layer 110 can be etched using a photolithography process to form the pattern of the reflective mask 106.

The EUV mask blank 102 can be formed with the substrate 104, the multilayer stack 106, the capping layer 108, and the absorber layer 110. The EUV mask blank 102 has an optically flat surface and can efficiently and uniformly reflect the extreme ultraviolet light. A mask pattern can be formed with the absorber layer 110 of the EUV mask blank 102 to provide and EUV mask or EUV reticle.

Figure 2:
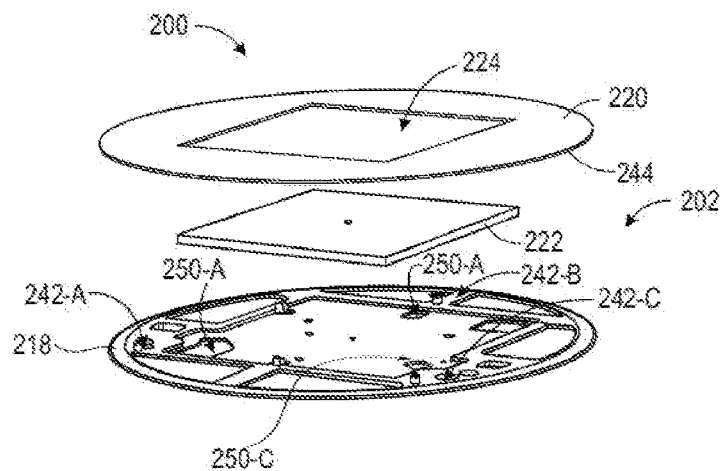
FIG. 2 illustrates an exploded view of an EUV reticle carrier assembly according to one or more embodiments.

FIG. 2 illustrates an exploded view of an EUV reticle carrier processing system 200 in use with an EUV reticle blank 222 therein. As shown, a reticle processing system 200 (hereinafter "system") includes an EUV reticle carrier assembly 202 coupled to and supported by a support assembly (not shown) that facilitates transport of an EUV reticle blank 222 into and out of processing chambers. In one or more embodiments, the EUV reticle carrier assembly 202 comprises a carrier base 218 and a carrier top shield 220. In one or more embodiments, a set of pins in the support assembly (not shown) extend through the openings 242A-C, 250A, and 250C in the carrier base 218 to support the EUV reticle carrier assembly 202.

More specifically, the EUV reticle carrier assembly 202 is lowered onto the support assembly (not shown) causing a first set of pins (not shown) to extend through a corresponding first set of openings 242A-C within the carrier base 218. The first set of pins (not shown) generally extend vertically higher than a second set of pins (not shown) as to come into contact with a bottom surface 244 of the carrier top shield 220 once assembled. The first set of pins (not shown) support and elevate the carrier top shield 220 over the EUV reticle blank 222. The first set of pins (not shown) each includes a domed upper tip (not shown) for minimally engaging the bottom surface 244 of the carrier top shield 220.

A second set of pins (not shown) generally extend through a second set of openings 250A and 250C within the carrier base 218 and engage the EUV reticle blank 222. The opening 250A is also a camera inspection opening. The second set of pins (not shown) engages the reticle 222 to support the reticle over the carrier base 218.

As shown, the carrier assembly 202 includes a carrier base 218 and a carrier top shield 220 respectively disposed below and above an EUV reticle blank 222. The carrier top shield 220 includes a central opening 224 formed therein to permit access to and ingress/egress of the EUV reticle blank 222 during processing. As shown, the central opening 224 of the carrier top shield 220 is generally aligned over the EUV reticle blank 222. In one non-limiting embodiment, the EUV reticle blank 222 is the EUV mask blank 102 of FIG. 1 having an ultra-low thermal expansion substrate of glass, silicon, or other ultra-low thermal expansion material. The ultra-low thermal expansion materials may include fused silica, fused quartz, calcium fluoride, silicon carbide, silicon oxide-titanium oxide alloy, or other material having a thermal coefficient of expansion within the range of these materials.

It has been discovered that some defects observed during processing of EUV mask blanks are attributed to the layers deposited on the EUV reticle carrier assembly 202 flaking off of the EUV reticle carrier assembly 202. In particular, it was determined that the absorber layer material deposited on the EUV reticle carrier assembly 202 flaked from the EUV reticle carrier assembly 202 and contributed defects on EUV mask blanks held within. Flaking from the carrier is addressed and reduced according to one or more embodiments disclosed herein.

Figure 5:
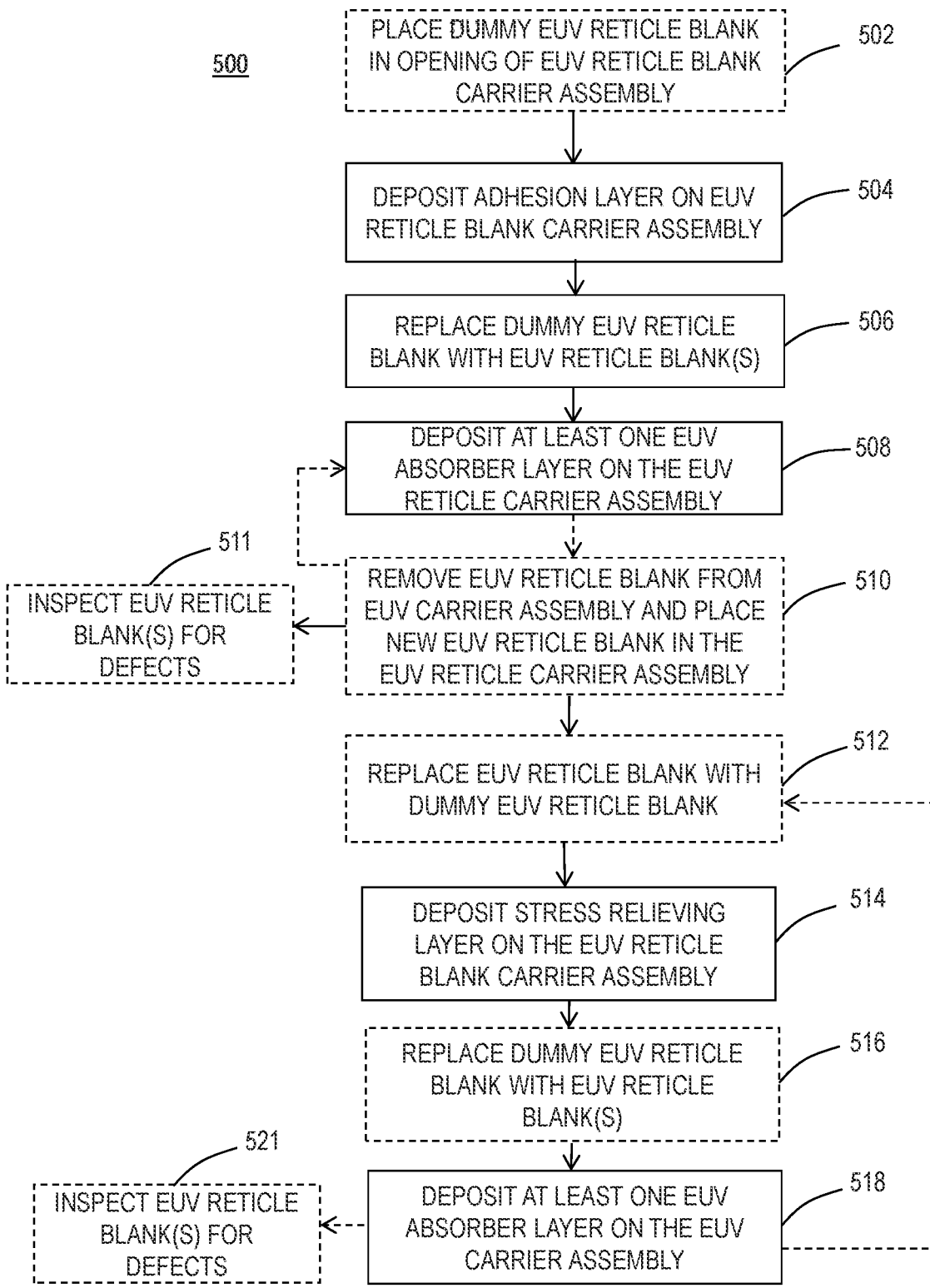
FIG. 5 is a flowchart illustrating an exemplary method for coating an EUV reticle carrier assembly according to the present disclosure.

For example, FIG. 5 illustrates an exemplary process flow diagram of a method 500 for coating an EUV reticle carrier assembly according to one or more embodiments. In one non-limiting embodiment, the EUV reticle carrier assembly is the EUV reticle carrier assembly 202 of FIG. 2. In one or more embodiments, at optional operation 502, a dummy EUV reticle blank is placed in the opening 224 of the EUV reticle carrier assembly 202 before depositing layers an adhesion material, an EUV absorber material, and a stress-relieving material. In one or more embodiments, the dummy EUV reticle blank may serve as a sacrificial dummy EUV reticle blank used between subsequent depositions of layers as disclosed herein.

In one or more embodiments, at operation 504 an adhesion layer is deposited directly on the EUV reticle carrier assembly 202. The EUV reticle carrier assembly in one or more embodiments is the EUV reticle carrier assembly 202 shown in FIG. 2 and including a carrier base 218 and a carrier top shield 220 having an opening 214 configured to receive an EUV reticle blank 22. In one or more embodiments, the adhesion layer forms a continuous film on the carrier shield. In some embodiments, the EUV reticle carrier assembly comprises a surface stress and a surface energy, and the adhesion layer has a surface energy such that the adhesion layer does not increase the surface stress of the EUV reticle carrier assembly. In some embodiments, these stress energies are measured in units of joules per meter squared ($J/m^2$) and can be measured using a contact angle test with water or other liquids.

As explained in further detail below, in one or more embodiments the adhesion layer reduces defects attributed to handling the EUV reticle carrier assembly (e.g. loose particles) by pasting loose particles present in and around the EUV reticle carrier assembly during processing onto the EUV reticle carrier assembly.

In one or more embodiments, at optional operation 506 the dummy EUV reticle blank is replaced with an EUV reticle blank 222 of the type shown in FIG. 2. In one or more embodiments, at operation 508 at least one EUV absorber layer is deposited on the EUV reticle carrier assembly 202. The at least one EUV absorber layer has an EUV absorber layer surface energy lower than that of the EUV reticle carrier assembly surface energy. In one or more embodiments, at optional operation 510 the EUV reticle blank is removed from the EUV reticle carrier assembly and a new EUV reticle blank 222 is placed into the EUV reticle carrier assembly at which time the method optionally returns to operation 508 up to a number of times e.g., 5, 10, 20, 30, 40, 50 or up to 100 times) allowing for multiple depositions of EUV absorber layers on the EUV reticle carrier assembly.

In one or more embodiments, at optional operation 511 the EUV reticle blank removed from the EUV reticle carrier assembly during operation 510 is inspected for defects. In one or more embodiments, at operation 512, the EUV reticle blank of operation 508 or optional operation 510 is then replaced with a new dummy EUV reticle blank.

In one or more embodiments, at operation 514, a stress-relieving layer is deposited on the EUV reticle carrier assembly, the stress-relieving layer having a surface energy that is less than the EUV absorber layer surface energy of the at least one EUV absorber layer. In one or more embodiments, at optional operation 516, the dummy EUV reticle blank is replaced with a new EUV reticle blank. In one or more embodiments, a new EUV reticle blank is placed in the EUV reticle carrier assembly after deposition of a stress-relieving layer.

In one or more embodiments, at operation 518, at least one EUV absorber layers are deposited on the EUV reticle carrier assembly. In one or more embodiments, at optional operation 521 the EUV reticle blank is removed from the carrier assembly and inspected for defects. In one or more embodiments, after operation 518 the process optionally returns to operation 512 to repeat operations 512-518 wherein additional layers of the at least one EUV absorber layer and additional stress-relieving layers are deposited on the EUV reticle carrier assembly 202. In one or more embodiments, repeating operations 512-518 comprise depositing alternating layers of the at least one EUV absorber layer and the stress-relieving layer.

In some embodiments, the method may further comprise depositing alternating layers of the at least one EUV absorber layer and the stress-relieving layer on the EUV reticle carrier assembly. In some embodiments, the method comprises depositing additional stress-relieving layers on the EUV reticle carrier assembly. In some embodiments, the method comprises forming a multilayer stack of alternating layers of the at least one EUV absorber layer and the stress-relieving layer on the EUV reticle carrier assembly.

In some embodiments, the method comprises comprising depositing n EUV absorber layers, wherein n is an integer in a range of from 1 to 10.

Figure 3:
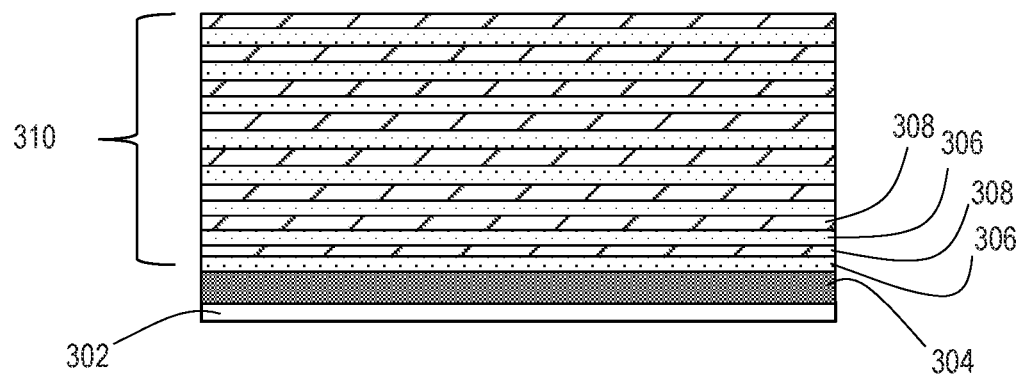
FIG. 3 illustrates a cross-sectional view of a reticle carrier assembly having a plurality of layers deposited thereon according to an embodiment of the disclosure.

FIG. 3 illustrates a cross-sectional view of a portion of an EUV reticle carrier assembly 300 having a plurality of layers deposited thereon according to one or more embodiments. In one or more embodiments, an adhesion layer 304 deposited on the EUV reticle carrier assembly material 302 (e.g. aluminum). The adhesion layer 304 may comprise any suitable material to the skilled artisan. In one or more embodiments, the adhesion layer 304 comprises a material selected from the group consisting of tantalum (Ta), tantalum-nitrides ($Ta_xN_y$), titanium (Ti), chromium (Cr), chromium-titanium alloys ($Cr_xTi_y$), and molybdenum (Mo) where x and y are integers and x is greater than y. In one or more embodiments, the adhesion layer 304 is configured to adhere loose particles to the EUV reticle carrier assembly that may be present on the EUV reticle carrier assembly or in the immediate surrounding area.

In one or more embodiments, a multilayer stack 310 is deposited on top of the adhesion layer 304. In one or more embodiments, the multilayer stack 310 comprises alternating layers of at least one EUV absorber layer 306 and a stress-relieving layer 308. In one or more embodiments, the at least one EUV absorber layer 306 comprises a material selected from the group consisting of tantalum-nitride ($Ta_xN_y$), tantalum-boron-nitride ($Ta_xBN_y$), nickel-tantalum alloys (Ni—Ta alloys), and aluminum-based alloys where x and y are integers and x is greater than y. The skilled artisan will recognize that the use of formulas like $Ta_xN_y$ and $Ta_xBN_y$ to represent tantalum-nitrides and tantalum-boron-nitrides does not imply any particular stoichiometric relationship between the elements. The formula merely identifies the primary elements of the layers.

In one or more embodiments, the stress-relieving layer 308 comprises a material selected from a group consisting of tantalum (Ta), tantalum-alloys, tantalum-nitride ($Ta_xN_y$), tantalum-boron-nitride ($Ta_xBN_y$), chromium-nitride (CrN), chromium (Cr), and chromium-alloys where x and y are integers and x is greater than y. The skilled artisan will recognize that the use of formulas like $Ta_xN_y$ and $Ta_xBN_y$ to represent tantalum-nitrides and tantalum-boron-nitrides does not imply any particular stoichiometric relationship between the elements. The formula merely identifies the primary elements of the layers. In specific embodiments, the metal-nitride content of the stress-relieving layer 308 is less than the metal-nitride content of the at least one EUV absorber layer 306. In one or more embodiments, the at least one EUV absorber layer 306 and the stress-relieving layer 308 comprise a material of a similar formula (e.g. $Ta_xN_y$, $Ta_xBN_y$), but differ in nitrogen content where the stress-relieving layer 308 has less nitrogen content than that of the material comprising the at least one EUV absorber layer 306. In one or more embodiments, both the stress-relieving layer 308 and the EUV absorber layer 306 comprise a material having the formula $Ta_xN_y$ wherein the respective layers have different ratios of nitrogen to tantalum and the nitrogen content of the stress-relieving layer 308 is less than that of the nitrogen content of the at least one EUV absorber layer 306.

In one or more embodiments, the multilayer stack 310 can be formed using a physical vapor deposition technique, such as magnetron sputtering. In an embodiment, the adhesion layer 304 and the multilayer stack 310 (comprising alternating layers of at least one EUV absorber layer 306 and stress-relieving layer 308) are formed using physical vapor deposition.

The EUV reticle carrier assembly material 302 and the adhesion layer 304 have a surface energy and a compressive stress, while the at least one EUV absorber layer 306 and the stress-relieving layer 308 each comprise materials that have a surface energy. The adhesion layer 304 has a surface energy that is intermediate between the surface energy of the EUV reticle carrier assembly material 302 and the surface energy of that at least one EUV absorber layer 306. The surface energy of the at least one EUV absorber layers 306 and the stress-relieving layers 308 is measured in units of MPa and can be measured using a wafer curvature test. In one or more embodiments, the carrier assembly material 302 comprises aluminum.

In one or more embodiments, the material comprising the at least one EUV absorber layer 306 has an EUV absorber layer surface energy and the stress-relieving layer 308, such as tantalum-nitride (TaN), has a surface energy that is less than the EUV absorber layer surface energy of the at least one EUV absorber layer 306. In one or more embodiments, the surface energy of the stress-relieving layer 308 has a lower surface energy than the surface energy of the at least one EUV absorber layer 306. In alternative embodiments, the surface energy of the stress-relieving layer 308 may be a tensile stress energy (e.g. oppositely signed than a compressive stress energy value). The difference in the relative surface energies of the at least one EUV absorber layer 306 and the stress-relieving layer 308 serve to reduce the overall stress exerted on the EUV reticle carrier assembly material 302, the adhesion layer 304, and the multilayer stack 310 deposited thereon. In one or more embodiments, the stress-relieving layer 308 comprises a metal-nitride with less nitrogen content than a metal-nitride comprising the at least one EUV absorber layer 306.

As previously set forth, a source of defects is flaking of the EUV absorber layer from the EUV reticle carrier assembly. While the present claims or disclosure should not be bound by any particular theory, it is believed that stress accumulates due to the cumulative stress energy buildup of multiple single phase EUV absorber layers deposited on the EUV reticle carrier assembly. For example, deposition of multiple TaN layers to an accumulated thickness on the order of ~600 nm on the EUV reticle carrier assembly results in failure and flaking of the TaN layers. In one or more embodiments, the adhesion layer forms a continuous film on the carrier shield material. In some embodiments, the adhesion layer does increase the overall stress of the carrier shield once deposited. In some embodiments, the adhesion layer has the property wetting the carrier shield (namely, portions of the carrier assembly exposed to deposition). The material property determining the wettability is surface energy. The surface energy of the adhesion layer is preferably intermediate to that of substrate material and absorber material.

While the present claims or disclosure should not be bound by any particular theory, it is believed that flaking may be due to a large CTE mismatch induced by compressive stress at the interface between the surface of the EUV reticle carrier assembly and the at least one EUV absorber layer, causing defects on EUV mask blanks. Deposition of the adhesion layer 304 reduces CTE mismatch in addition to pasting loose particles that may be present in and around the EUV reticle carrier assembly to the EUV reticle carrier assembly material 302.

The physical dimensions of the layers of the multilayer stack 310 formed using a physical vapor deposition technique precisely control the thickness of the layers deposited on the EUV reticle carrier assembly material 302. In one or more embodiments, the adhesion layer 304, such as a layer of tantalum-nitride (TaN), has a thickness in the range of from 100 nm to 1000 nm. In one or more embodiments, the at least one EUV absorber layer 306 has a thickness in the range of from about 40 nm to 80 nm. In one or more embodiments, the stress-relieving layer, such as a layer of chromium-nitride (CrN), has a thickness in the range of from about 50 nm to 300 nm. The thickness and composition of the layers affects the overall stress energy on the EUV reticle carrier assembly and the layers deposited thereon.

The chemical compositions of the layers of the multilayer stack 310 formed using a physical vapor deposition technique can be precisely controlled to decrease interlayer stress of the different layers deposited on the EUV reticle carrier assembly material 302. In one or more embodiments, the adhesion layer 304 has a surface energy intermediate to that of the EUV reticle carrier assembly material 302 (e.g. aluminum) and the at least one EUV absorber layer material 306. In one or more embodiments the surface energy of the stress-relieving layer 308 is less than the surface energy of the at least one EUV absorber layer 306. In alternate embodiments, the surface energy of the stress-relieving layer 308 is oppositely signed (e.g. tensile) compared to the surface energy of the at least one EUV absorber layer 306.

According to one or more embodiments, the methods described herein provide for reduced EUV absorber layer defects through deposition stress-relieving layers and EUV absorber layers on EUV carrier assemblies. In addition, one or more embodiments provide reusability of an EUV reticle carrier assembly for multiple EUV mask blank deposition processes with reduced defects.

Figure 4:
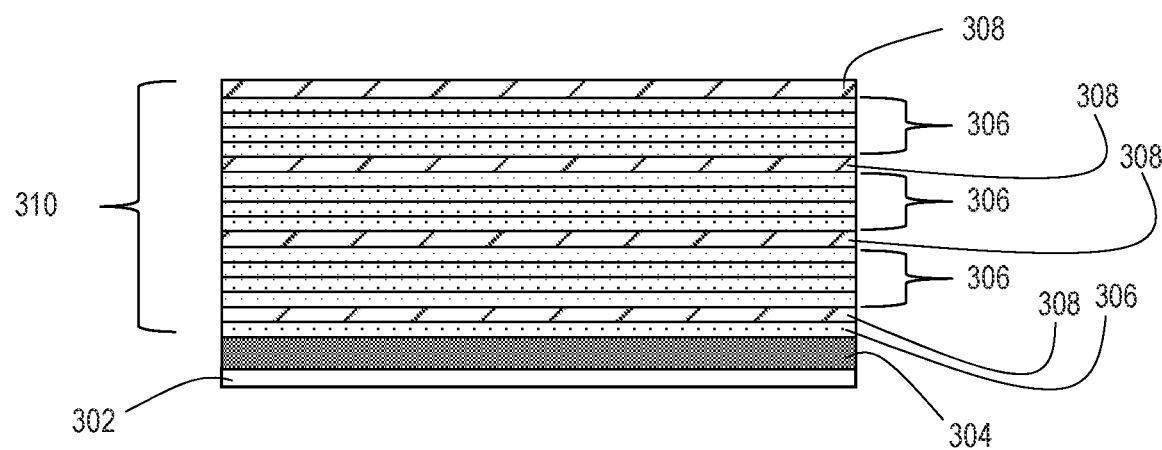
FIG. 4 illustrates a cross-sectional view of an EUV reticle carrier assembly having a plurality of layers deposited thereon according to an alternative embodiment of the disclosure.

FIG. 4 illustrates a cross-sectional view of EUV reticle carrier assembly 300 having a plurality of layers thereon according to one or more alternative embodiments. With reference to FIG. 4, an adhesion layer 304 is deposited on the EUV carrier assembly material 302. In one or more embodiments, a multilayer stack 310 is formed on the adhesion layer 304. Specifically, the multilayer stack 310 comprises multiple EUV absorber layers 306 alternating with a stress-relieving layer 308. As illustrated in FIG. 4, in one or more embodiments four EUV absorber layers 306 are deposited between depositions of a stress-relieving layer to form the multilayer stack 310. So as not to be limiting, the number of EUV absorber layers 306 between the stress-relieving layers 308 can number from one EUV absorber layer 306 to up to ten EUV absorber layers 306 to form the multilayer stack 310. In specific embodiments, the multilayer stack 310 comprises n EUV absorber layers 306 where n is an integer in a range of from 1 to 10.

Reference throughout this specification to "one embodiment," "certain embodiments," "various embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in various embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein provided a description with reference to particular embodiments, it is to be understood that these embodiments are merely illustrative of the principles and applications of the disclosure. It will be apparent to those skilled in the art that various modifications and variations can be made to the present disclosure without departing from the spirit and scope thereof. Thus, it is intended that the present disclosure include modifications and variations that are within the scope of the appended claims and their equivalents.

What is claimed is:

1. A method of coating an extreme ultraviolet (EUV) reticle carrier assembly, the method comprising:

depositing an adhesion layer on an EUV reticle carrier assembly, the EUV reticle carrier assembly comprising a carrier base and a carrier top shield having an opening configured to receive an EUV reticle blank and the EUV reticle carrier assembly comprising an EUV reticle carrier assembly surface stress and a surface energy, the adhesion layer having an adhesion layer surface energy such that the adhesion layer does not increase the surface stress of the EUV reticle carrier assembly;

depositing at least one EUV absorber layer on the EUV reticle carrier assembly, the at least one EUV absorber layer having an EUV absorber layer surface energy that is intermediate to the EUV reticle carrier assembly surface energy and the adhesion layer surface energy; and depositing a stress-relieving layer on EUV reticle carrier assembly, the stress-relieving layer having a surface energy that is less than the EUV absorber layer surface energy of the at least one EUV absorber layer.

2. The method of claim 1 further comprising depositing alternating layers of the at least one EUV absorber layer and the stress-relieving layer on the EUV reticle carrier assembly.

3. The method of claim 1, wherein a dummy EUV reticle blank is placed in the opening before depositing the adhesion layer and before depositing the stress-relieving layer.

4. The method of claim 1, wherein an EUV reticle blank is placed in the opening before depositing the at least one EUV absorber layer.

5. The method of claim 4, further comprising depositing additional layers of the at least one EUV absorber layer on the EUV reticle carrier assembly while the EUV reticle blank is in the opening.

6. The method of claim 5, further comprising depositing additional stress-relieving layers on the EUV reticle carrier assembly.

7. The method of claim 6, further comprising forming a multilayer stack of alternating layers of the at least one EUV absorber layer and the stress-relieving layer on the EUV reticle carrier assembly.

8. The method of claim 1, further comprising depositing n EUV absorber layers, wherein n is an integer in a range of from 1 to 10.

9. The method of claim 2, wherein the surface energy of the stress-relieving layer is less than the surface energy of the at least one EUV absorber layer.

10. The method of claim 1, wherein the at least one EUV absorber layer comprises a material selected from the group consisting of $Ta_xN_y$, $Ta_xBN_y$, Ni—Ta alloys, and aluminum-based alloys, and the adhesion layer comprises a material selected from the group consisting of Ta, $Ta_xN_y$, Ti, Cr, $Cr_xTi_y$, and Mo.

11. The method of claim 10, wherein x and y are integers and in the adhesion layer, x is greater than y.

12. The method of claim 10, wherein the adhesion layer is configured to adhere loose particles to the EUV reticle carrier assembly.

13. The method of claim 1, wherein the stress-relieving layer comprises a material selected from a group consisting of Ta, Ta alloys, $Ta_xN_y$, $Ta_xBN_y$, CrN, Cr, and chromium-alloys.

14. The method of claim 13, wherein in the stress-relieving layer, x and y are integers and x of $Ta_xN_y$ and $Ta_xBN_y$ is greater than y.

15. The method of claim 1, wherein the stress-relieving layer comprises a metal-nitride with less nitrogen content than a metal-nitride of the at least one EUV absorber layer.

16. The method of claim 1, wherein the adhesion layer has a thickness in a range of from about 100 nm to about 1000 nm.

17. The method of claim 16, wherein the at least one EUV absorber layer has a thickness in a range of from about 40 nm to about 80 nm.

18. The method of claim 1, wherein the stress-relieving layer has a thickness in a range of from about 50 nm to about 300 nm.

19. A method of coating an extreme ultraviolet (EUV) reticle carrier assembly, the method comprising:
    placing a dummy EUV reticle blank in an opening of an EUV reticle carrier assembly, the EUV reticle carrier assembly comprising a carrier base, and a carrier top shield having the opening therein configured to receive an EUV reticle blank, the EUV reticle carrier assembly comprising a surface stress and a surface energy;
    depositing an adhesion layer on the EUV reticle carrier assembly, the adhesion layer the adhesion layer having a surface energy such that the adhesion layer does not increase the surface stress of the EUV reticle carrier assembly;
    depositing at least one EUV absorber layer on the EUV reticle carrier assembly, the at least one EUV absorber layer having an EUV absorber layer surface energy that is intermediate to the EUV reticle carrier assembly surface energy and the adhesion layer surface energy;
    replacing the dummy EUV reticle blank with an EUV reticle blank in the opening of the carrier top shield;
    depositing a stress-relieving layer on EUV reticle carrier assembly, the stress-relieving layer having a surface energy that is less than the EUV absorber layer surface energy of the at least one EUV absorber layer; and
    depositing alternating layers of the at least one EUV absorber layer and the stress-relieving layer on the EUV reticle carrier assembly.

20. The method of claim 19, wherein the at least one EUV absorber layer further comprises n EUV absorber layers, wherein n is an integer in a range of from 1 to 10.

* * * * *